(12) United States Patent
Reboh et al.

(10) Patent No.: US 12,327,719 B2
(45) Date of Patent: Jun. 10, 2025

(54) SEMICONDUCTOR SUBSTRATE POLISHING METHOD

(71) Applicant: Commissariat à l'Énergie Atomique et aux Énergies Alternatives, Paris (FR)

(72) Inventors: Shay Reboh, Grenoble (FR); Jean-Michel Hartmann, Grenoble (FR); Frederic Mazen, Grenoble (FR); Frédéric Milesi, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 813 days.

(21) Appl. No.: 17/529,355

(22) Filed: Nov. 18, 2021

(65) Prior Publication Data

US 2022/0157612 A1 May 19, 2022

(30) Foreign Application Priority Data

Nov. 19, 2020 (FR) ...................................... 2011912

(51) Int. Cl.
| | |
|---|---|
| *H01L 21/02* | (2006.01) |
| *H01L 21/265* | (2006.01) |
| *H01L 21/306* | (2006.01) |
| *H01L 21/762* | (2006.01) |

(52) U.S. Cl.
CPC .... *H01L 21/0201* (2013.01); *H01L 21/02002* (2013.01); *H01L 21/26586* (2013.01); *H01L 21/30604* (2013.01); *H01L 21/76254* (2013.01)

(58) Field of Classification Search
CPC ........... H01L 21/0201; H01L 21/02002; H01L 21/76254; H01L 21/26586; H01L 21/76259
See application file for complete search history.

(56) References Cited

U.S. PATENT DOCUMENTS

| | | | |
|---|---|---|---|
| 7,084,046 B2 * | 8/2006 | Mitani | H01L 21/76254 438/459 |
| 9,570,340 B2 * | 2/2017 | Grenouillet | H01L 21/76283 |
| 2018/0350612 A1 | 12/2018 | Schulze et al. | |

FOREIGN PATENT DOCUMENTS

| | | |
|---|---|---|
| EP | 0 615 004 A1 | 9/1994 |
| JP | H03-190233 A | 8/1991 |
| WO | WO 2014/037410 A1 | 3/2014 |

OTHER PUBLICATIONS

Preliminary Search Report for French Application No. 2011912, dated Sep. 6, 2021.

* cited by examiner

*Primary Examiner* — Daniel Luke
(74) *Attorney, Agent, or Firm* — Wolf, Greenfield & Sacks, P.C.

(57) ABSTRACT

A method of polishing a semiconductor substrate, including: a) a step of multiple implantations of ions from an upper surface of the substrate, to modify the material of an upper portion of the substrate, the multiple implantation step comprising a plurality of successive implantations under different respective implantation orientations; and b) a step of selective removal of the upper portion of the substrate.

15 Claims, 3 Drawing Sheets

SEMICONDUCTOR SUBSTRATE POLISHING METHOD

CROSS-REFERENCE TO RELATED APPLICATIONS

This application claims priority to French application number 2011912, filed Nov. 19, 2020. The contents of which is incorporated herein by reference in its entirety.

TECHNICAL BACKGROUND

The present disclosure generally concerns the field of microelectronics, and more particularly aims at a semiconductor substrate polishing method.

PRIOR ART

Conventionally, in the field of microelectronics, it is known to remove surface structures or to decrease the roughness of a semiconductor substrate by methods of mechanical abrasion of chemical-mechanical polishing (CMP) or ion bombarding polishing type.

It would be desirable to at least partly improve certain aspects of known polishing methods.

SUMMARY

For this purpose, an embodiment provides a method of polishing a semiconductor substrate, comprising:
  a) a step of multiple implantations of ions from an upper surface of the substrate, to modify the material of an upper portion of the substrate, the multiple implantation step comprising a plurality of successive implantations under different respective implantation orientations; and
  b) a step of selective removal of the upper portion of the substrate.

According to an embodiment, the successive implantations implemented at step a) are carried out with a same implantation depth in a direction normal to the mean plane of the substrate.

According to an embodiment, step a) comprises a plurality of successive implantations under different respective angles of incidence and with different respective implantations energies.

According to an embodiment, step a) comprises a plurality of successive implantations under a same angle of incidence and with a same implantation energy, under different respective angles in a plane parallel to the mean plane of the substrate.

According to an embodiment, at step a), the implantation angle, in a plane parallel to the mean plane of the substrate, varies continuously.

According to an embodiment, at step a), the angle of incidence of implantation varies continuously.

According to an embodiment, the substrate is a single-crystal substrate.

According to an embodiment, step a) results in amorphizing said upper portion of the substrate.

According to an embodiment, the method further comprises, after step a), a step of solid phase recrystallization of a lower portion of said upper portion of the substrate.

According to an embodiment, the solid phase recrystallization step is implemented before step b).

According to an embodiment, the solid phase recrystallization step is implemented jointly to step b).

According to an embodiment, step a) results in doping the upper portion of the substrate while keeping its single-crystal structure.

According to an embodiment, the ions implanted at step a) are ions from the group comprising nitrogen, oxygen, fluorine, silicon, argon, germanium, xenon, carbon, and phosphorus.

According to an embodiment, at step b), the selective removal of the upper portion of the substrate is carried out by a method of thermal etching by means of a gaseous mixture.

According to an embodiment, the gaseous mixture contains chlorine.

According to an embodiment, the semiconductor substrate is made of silicon, and the gaseous mixture is a mixture based on hydrochloric acid and on germane, with a possible additional hydrogen stream.

According to an embodiment, at step a), the implantation conditions are selected to be adapted to causing a mechanical abrasion of the upper surface of the substrate.

According to an embodiment, at step a), the multiple implantations cause no mechanical abrasion of the upper surface of the substrate.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Figure 1:
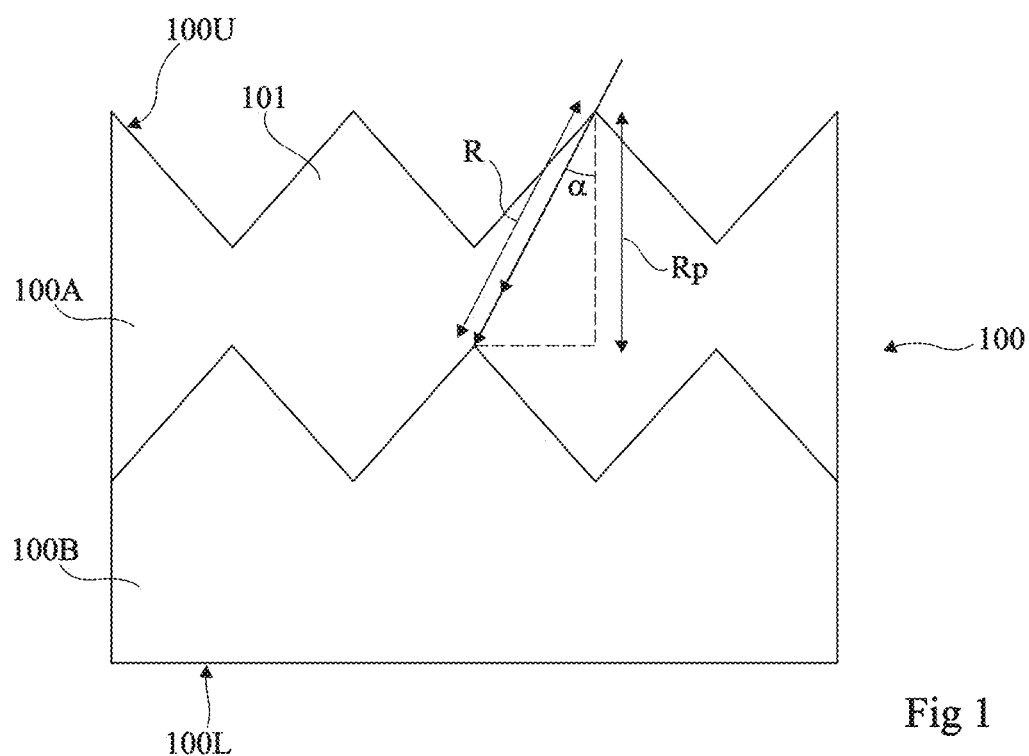
FIG. 1 is a partial simplified cross-section view illustrating a step of ion implantation in a semiconductor substrate.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the applications that may be made of the polishing methods described hereafter have not been detailed, the described embodiments being compatible with all or part of the applications capable of taking advantage of the polishing of a semiconductor substrate.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

As a non-limiting example, the polishing methods described hereafter may be used to decrease the surface roughness of a semiconductor layer transferred from an initial semiconductor substrate or donor substrate onto a destination substrate or receiver substrate, by a Smart-Cut™-type method. In such a method, the initial substrate may be a single-crystal substrate, for example, made of silicon. As an example, the initial substrate is in the form of a plate having two opposite main surfaces. Species, for example, hydrogen or helium ions, are implanted from a first main surface of the substrate to form a fragile layer, for example, a hydrogenated layer, buried in the substrate. The portion of the initial substrate located between the fragile buried area and the first main surface (or implantation surface) is intended to be transferred onto the destination substrate. Prior to the implantation, an electrically-insulating layer, for example, made of silicon oxide, may be formed on the first main surface of the initial substrate. The destination substrate may also be a plate-shaped substrate having two opposite main surfaces. As an example, the destination substrate is made of a semiconductor material, for example, of silicon. An electrically-insulating layer, preferably made of the same material as the electrically-insulating layer formed on the implantation surface of the initial substrate, may be formed on a first main surface of the destination substrate. The first main surface of the initial substrate is then covered with the destination substrate. As an example, the insulating layers respectively formed on the first main surface of the initial substrate and on the first main surface of the destination substrate are assembled for this purpose by the placing into contact of their surfaces which have remained accessible, that is, non-covered. Preferably, the assembly is of direct bonding type, also called molecular bonding. The described embodiments are however not limited to this specific case. A thermal and/or mechanical treatment is then carried out to cause a fracturing along the fragile buried layer. Thus, only a layer of the initial substrate, corresponding to the portion of the initial substrate located between the implantation surface and the fragile buried layer, remains on the destination substrate. A polishing of the surface which has remained accessible of the transferred layer is then implemented to decrease the surface roughness resulting from the fracturing of the fragile buried layer. The polishing methods described hereafter are particularly adapted to the implementation of this polishing.

More generally, the polishing methods described hereafter may be used for any application capable of taking advantage of a polishing of a semiconductor substrate exhibiting surface structures. The structures to be removed may be periodic, for example intentionally manufactured by a surface structuring method, or non-periodic, for example, randomly distributed, which is for example true for surface structures resulting from a Smart-Cut™-type method. As an example, the height of the structures may be smaller than or equal to 1 µm, for example, in the range from 10 nm to 1 µm, and preferably from 10 nm to 200 nm.

FIG. 1 is a partial simplified cross-section view illustrating a step of ion implantation in a semiconductor substrate 100, for example, a single-crystal substrate, for example, made of silicon. Substrate 100 is for example in the form of a plate comprising two opposite main surface 100U and 100L, respectively corresponding to the upper surface and to the lower surface in the orientation of FIG. 1. In this example, substrate 100 comprises structures or a roughness 101 on the side of its upper surface 100U. In FIG. 1, structures 101 are schematically shown in the form of periodic triangular patterns. The described embodiments are however not limited to this specific case.

During an ion implantation, the energy provided to the ions, also called implantation energy, can be accurately set. As a result, the ions penetrate into the material of the substrate down to a defined depth Rp, and this, with a defined lateral or depth uncertainty, called straggling. This results in very conformally projecting or replicating the structures of the upper surface inside of the material of the substrate, in terms of implanted ion concentration (to within the uncertainty linked to the implantation). The implantation results in modifying the nature of the material of the substrate all across the portion crossed by the species, that is, in an upper portion 100A of the substrate, impacted by the ions. The rest of the substrate forms a lower portion 100B of the substrate. In lower portion 100B, the nature of the material of the substrate remains unchanged.

The modification of the material of the substrate in the upper portion 100A of the substrate may comprise an amorphization of the initially crystalline material of the substrate or also a doping of the crystalline material of the substrate (for example, to obtain an upper doped single-crystal silicon portion 100A and a lower undoped single-crystal silicon portion 100B).

As illustrated in FIG. 1, due to the conformity of the implantation method, the interface between the modified upper portion 100A of the substrate and the unmodified lower portion 100B of the substrate replicates the pattern of the structures of the upper surface 100U of the substrate, with a lateral offset depending on the angle of incidence of the implantation beam relative to the mean plane of the substrate. More particularly, the upper surface of the unmodified lower portion 100B of the substrate defines a pattern similar to that of the upper surface 100U of the substrate, with a lateral offset depending on the angle of incidence of the implantation beam, while the lower surface of the modified upper portion 100A of the substrate defines a complementary pattern. In other words, each point of the upper surface of the substrate is projected onto the interface between portions 100A and 100B at a depth Rp, with a translation (lateral offset) depending on the angle of incidence of the implantation beam.

In practice, due to the straggling linked to the implantation, each point of the upper surface of the substrate is in reality projected onto the interface between portions 100A and 100B in the form of a cloud of points defined by the implantation depth Rp, the angle of incidence of the implantation beam, and the straggling. Thus, although a sharp interface has been shown in the drawing between portions 100A and 100B, in practice, a transition layer having a thickness linked to the implantation straggling extends at the interface between portions 100A and 100B.

Figure 2:
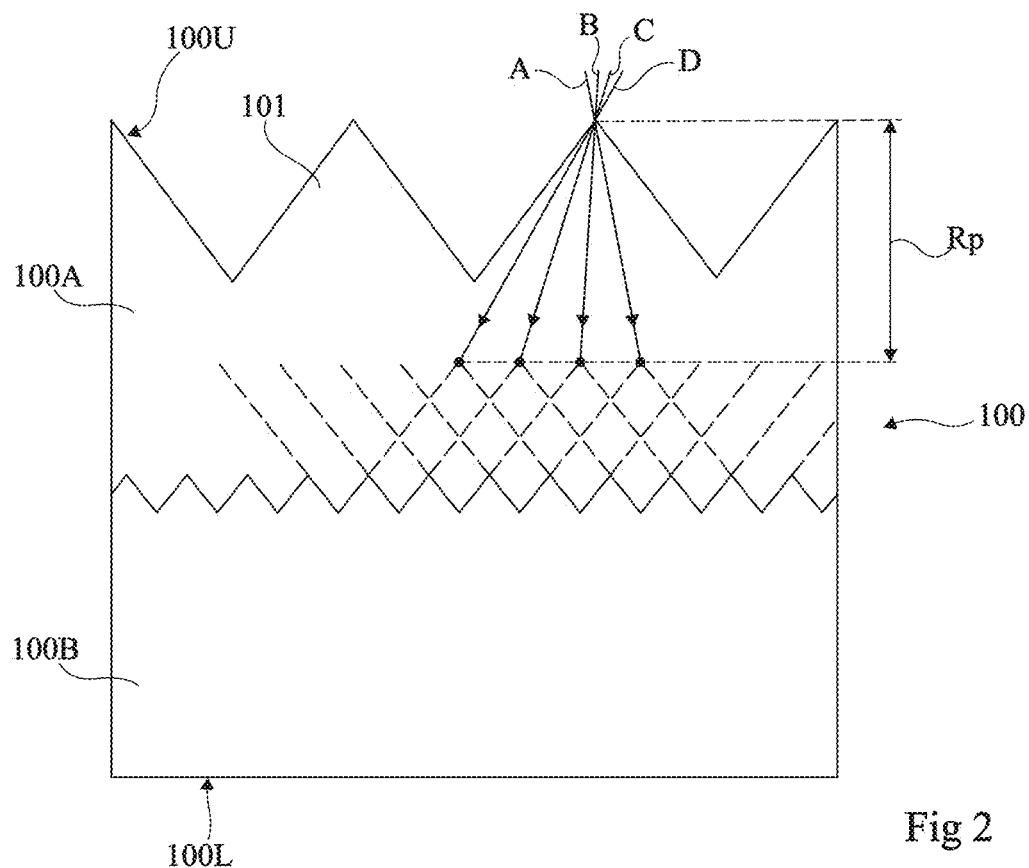
FIG. 2 is a partial simplified cross-section view illustrating a step of an example of a semiconductor substrate polishing method according to an embodiment.

FIG. 2 is a partial simplified cross-section view illustrating a step of an example of a method of polishing a semiconductor substrate 100 according to an embodiment. Substrate 100 is for example identical or similar to what has been described hereabove in relation with FIG. 1.

During this step, ions are implanted from the upper surface of substrate 100, to modify the nature of the material of an upper portion 100A of the substrate, similarly to what has been described hereabove in relation with FIG. 1. At the end of this step, a lower portion 100B of the substrate, in contact, by its upper surface, with the lower surface of portion 100A, remains unchanged.

The step of FIG. 2 more particularly comprises a plurality of successive steps of ion implantation with different respective implantation orientations. As an example, the step of FIG. 2 comprises from 3 to 20, and preferably from 4 to 10 successive implantation steps with different respective implantation orientations. In FIG. 2, four implantations A, B, C, and D have been respectively shown by rays, with respectively four different angles of incidence.

At each implantation step, the implantation step is selected according to angle of incidence α, on to the desired implantation depth Rp (FIG. 1). Angle α corresponds to the angle of incidence of the implantation beam defined with respect to the main plane or mean plane of substrate 100 (horizontal in the shown examples), that is, the angle formed between the implantation beam and the normal to the main plane of substrate 100. Implantation depth Rp is defined as being the distance traveled by the ions inside of substrate 100 along a direction normal to the main plane or mean plane of substrate 100 (that is, along a vertical direction in the shown examples). Thus, defining by R the distance traveled by the ions inside of the substrate in the implantation direction, the implantation depth Rp is defined as follows:

$$Rp = R \cdot \cos(\alpha) \qquad \text{[Math 1]}$$

In the example of FIG. 2, at each implantation step, the implantation energy is selected so that the implantation depth Rp is substantially the same for all implantation steps, for example, in the range from 1 to 4 times the height of the roughness 101 to be corrected. As an example, implantation depth Rp is in the range from 10 nm to 1 μm, for example from 10 to 200 nm. As illustrated, in particular, in FIG. 2, the modified portion 100A of the substrate forms a continuous layer extending all over the surface of the substrate. This layer 100A has a thickness greater than or equal to the height of roughness 101.

Preferably, ions of same nature are used during the different implantation steps, for example, nitrogen ions, oxygen ions, fluorine ions, silicon ions, argon ions, germanium ions, xenon ions, carbon ions, or phosphorus ions.

As schematically illustrated in FIG. 2, the fact of providing a plurality of implantations under different angles of incidence and at a same implantation depth enables to decrease the roughness of the interface between the upper 100A and lower 100B portions of the substrate with respect to the roughness of the upper surface of substrate 100. More particularly, this results in decreasing the height (vertical dimension), the width (horizontal dimension), and the pitch (horizontal spacing) of the structures at the interface between the upper 100A and lower 100B portions of substrate 100, respectively with respect to the height, to the width, and to the pitch of the structures of the upper surface 100U of substrate 100.

It should be noted that FIG. 2 is a two-dimensional representation (cross-section view) of substrate 100. In practice, for each fixed angle of incidence α (different from 90°), a plurality of successive implantations under angle of incidence α may be provided, with the same implantation energy, by each time modifying the angle, in a plane parallel to the mean plane of the substrate, between the ion beam emission source and the central normal axis of substrate 100, called horizontal angle or azimuth hereafter. To modify the horizontal angle, a rotation around its central normal axis may for example be applied to the substrate. As a variant, for each angle of incidence α, the rotation of the substrate around its central normal axis may be continuous, for example, with a constant rotation speed, all along the duration of the implantation.

Further, although an example of embodiment where angle of incidence α varies in stages between the successive implantations, a continuous variation of angle of incidence α may be provided, according to a determined angular scanning, preferably by also continuously modifying the implantation energy so that implantation depth Rp is substantially the same for all the covered angles α.

As a variant, it may be provided to implant the ions under a single angle of incidence α and with a same implantation energy, but under different respective horizontal angles. Here again, this enables to decrease the roughness of the interface between the upper 100A and lower 100B portions of the substrate with respect to the roughness of the upper surface of substrate 100. Here again, to modify the horizontal angle, a rotation around its central normal axis may for example be applied to the substrate, where the rotation may be either a rotation in discrete stages, or a continuous rotation all along the duration of the implantation.

Thus, in the present description, implantation orientation designates a combination of an angle of incidence α and of a horizontal angle of the implantation beam relative to the mean plane of substrate 100. A plurality of successive steps of ion implantation with different respective implantation orientations means that, at each new step, the angle of incidence and/or the horizontal angle of the implantation beam is modified with respect to the previous implantation step, it being understood that the angle modifications may be discontinuous (in stages) or continuous. If angle of incidence α is modified, the implantation energy is preferably accordingly modified, to maintain the implantation depth Rp substantially constant. If only the horizontal angle of the implantation beam is modified, the implantation energy remains unchanged. Thus, the implantation depth remains substantially the same for all the implantation steps of the multiple implantation step of FIG. 2.

Figure 3:
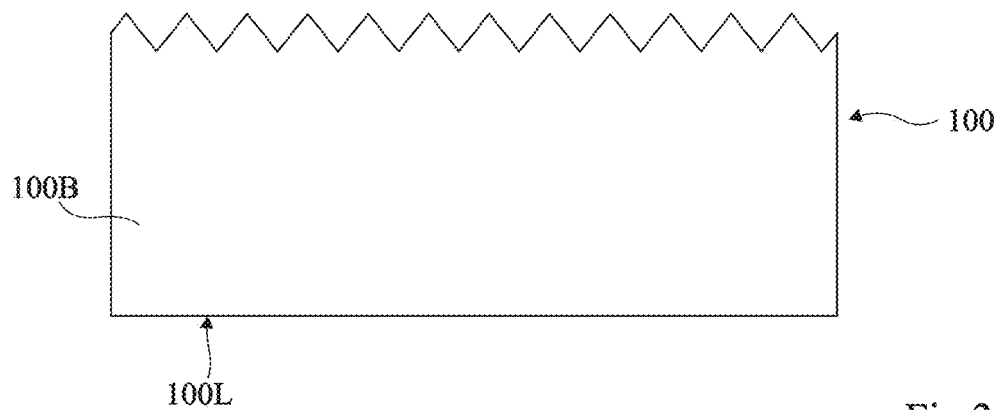
FIG. 3 is a partial simplified cross-section view illustrating another step of an example of a semiconductor substrate polishing method according to an embodiment.

FIG. 3 illustrates a step subsequent to the multiple implantation step of FIG. 2. During this step, the modified upper portion 100A of substrate 100 is modified selectively over the unmodified lower portion 100B of substrate 100. At the end of this step, only the lower portion 100B of substrate 100 is kept. As explained hereabove, the upper surface of the portion 100B of substrate 100 has a lower roughness than that of the upper surface 100U of the initial substrate. Thus, the combination of the steps of FIGS. 2 and 3 has enabled to polish the upper surface of substrate 100.

The selective removal of the upper portion 100A of the substrate with respect to lower portion 100B is made possible by the difference in structure (crystalline structure versus amorphous structure) and/or in chemical composition between the two portions. The removal of the upper portion 100A of the substrate may be performed by any adapted selective etch method, for example by an etch method based on gaseous compounds, for example, on gaseous compounds containing chlorine atoms. As an example, in the case of a single-crystal silicon substrate 100 and of an implantation resulting in amorphizing the upper portion 100A of the substrate, the amorphous portion 100A of substrate 100 can be removed selectively over single-crystal portion 100B by a method of selective etching by means of a gaseous mixture based on hydrochloric acid (HCl) and on germane ($GeH_4$). The described embodiments are however not limited to this specific case. More generally, it will be within the abilities of those skilled in the art to select an adapted selective etch method according to the nature of the materials of portions 100A and 100B, particularly a wet or plasma etching.

Figure 4:
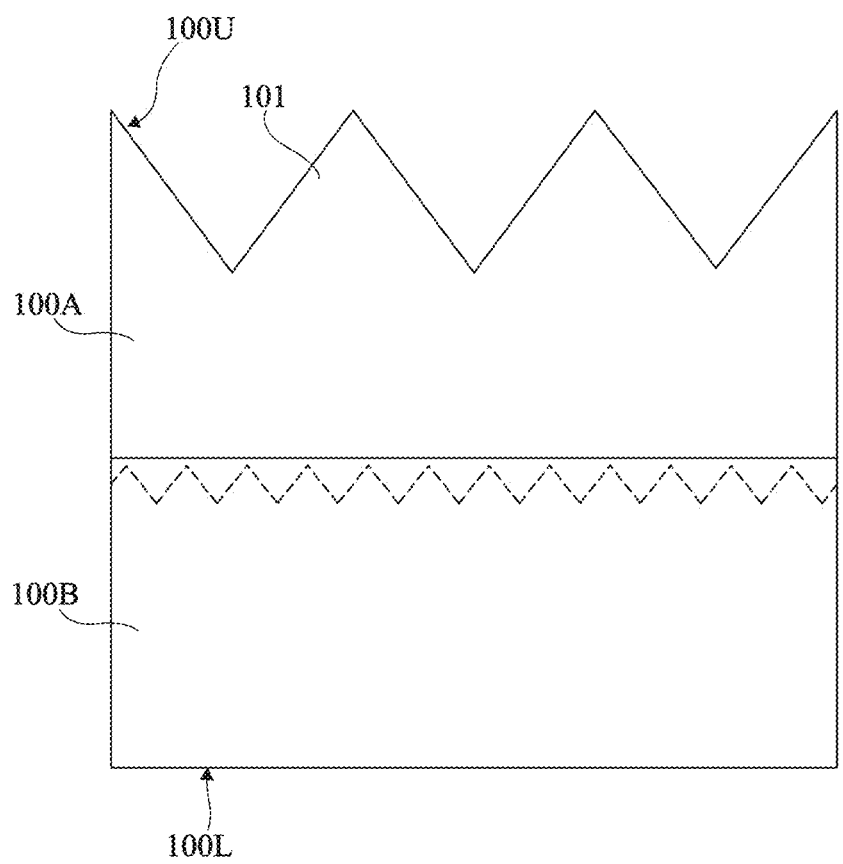
FIG. 4 is a partial simplified cross-section view illustrating a step of a variant of a semiconductor substrate polishing method according to an embodiment.

FIG. 4 is a partial simplified cross-section view illustrating a variant of the polishing method described hereabove in relation with FIGS. 1 and 2.

FIG. 4 more particularly illustrates an intermediate step between the multiple implantation step of FIG. 2 and the step of selective removal of the modified upper portion 100A of substrate 100. In this example, it is considered that the multiple implantation implemented at the step of FIG. 2 has resulted in amorphizing the upper portion 100A of substrate 100, while the lower portion 100B of substrate 100 has remained monocrystalline.

During the step of FIG. 4, a solid phase recrystallization anneal is applied to the structure obtained at the end of the multiple implantation step of FIG. 2. This results in initiating an epitaxial recrystallization of the amorphous portion 100A of the substrate, starting from the upper surface of the crystalline portion 100B of the substrate. At the beginning of the epitaxial recrystallization phase, the interface between the crystalline portion 100B and the amorphous portion 100A of the substrate tends to level. This results in attenuating or removing the roughness of the upper surface of crystal layer 100B. This phenomenon is illustrated in FIG. 4, where the initial roughness (that is, before the solid phase recrystallization anneal) of the upper surface of crystal layer 100B has been shown in dashed lines. The anneal is then interrupted to keep an upper amorphous substrate portion 100A.

The anneal temperature is selected to be sufficiently low not to induce a heterogeneous nucleation in amorphous portion 100A, and sufficiently high to allow an epitaxial recrystallization from the upper surface of portion 100B. As an example, in the case of a silicon substrate 100, the anneal temperature may be in the range from 470 to 600° C., for example, in the order of 530° C. The duration of the anneal is for example in the range from 1 to 30 minutes, for example, in the order of 10 minutes.

The amorphous upper portion 100A of the substrate may then be selectively removed identically or similarly to what has been previously described in relation with FIG. 3.

Thus, the variant of FIG. 4 enables to even further decrease the roughness of the upper surface of substrate 100.

In the above-described example, the solid phase recrystallization anneal is performed before the step of selective removal of the amorphous upper portion 100A of the substrate, and is decorrelated from said selective removal step.

As a variant, the solid phase recrystallization phase and the step of selective removal of the amorphous upper portion 100A of the substrate may be combined. For this purpose, the etch temperature will be selected to be substantially equal to the solid phase recrystallization temperature of the amorphous material of the upper portion 100A of the substrate, for example, for silicon, in the range from 470 to 600° C., for example, in the order of 530° C.

The etch method may for example comprise the following successive steps:
  temperature rise and stabilization at a temperature T1 substantially equal to the solid phase recrystallization temperature, for example, in the order of 500° C. for a silicon substrate, for example, under a hydrogen stream (H2);
  etching at temperature T1, by a gaseous mixture adapted to the material of the amorphous upper portion 100A of the substrate, for example, a mixture of hydrochloric acid and of germane (with possibly an additional hydrogen stream) for a silicon substrate; and
  fast decrease to a temperature T2 smaller than the solid phase recrystallization temperature, for example, in the order of 450° C. for a silicon substrate, for example, under a hydrogen stream.

Figure 5:
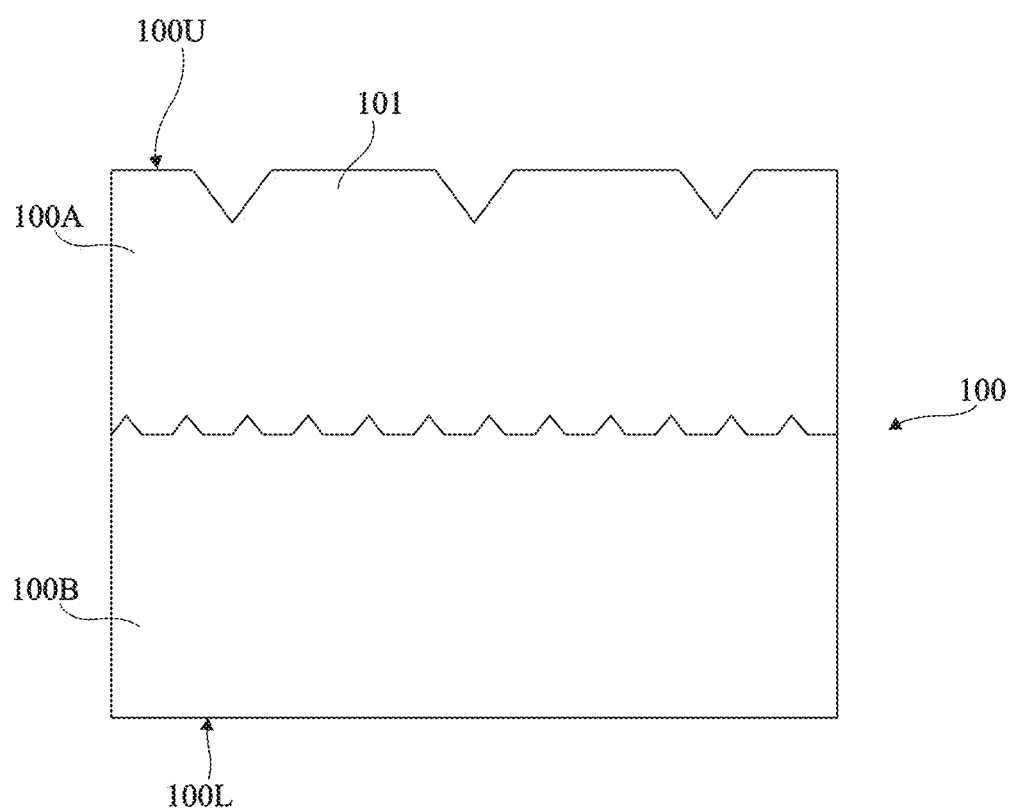
FIG. 5 is a partial simplified cross-section view illustrating a step of another variant of a semiconductor substrate polishing method according to an embodiment.

FIG. 5 is a partial simplified cross-section view illustrating another variant of the above-described polishing method.

FIG. 5 more particularly illustrates a variant of the multiple implantation step of FIG. 2.

In this variant, the successive implantation steps are carried out by means of beams of relatively heavy ions and with relatively high implantation doses. Under these conditions, an effect of sputtering or mechanical abrasion of the upper surface 100U of substrate 1000 can be observed. This results in at least partially polishing the roughness of the upper surface of substrate 100. Accordingly, the roughness replicated on the upper surface of the unmodified lower region 100B of the substrate is decreased with respect to an ion implantation causing no mechanical abrasion of the upper surface of the substrate.

At the end of this step, the amorphous upper portion 100A of the substrate can be selectively removed, identically or similarly to what has been previously described in relation with FIG. 3.

Various embodiments and variants have been described. Those skilled in the art will understand that certain features of these various embodiments and variants may be combined, and other variants will occur to those skilled in the art. In particular, the described embodiments are not limited to the examples of numerical values or to the examples of materials mentioned in the description.

It should further be noted that the above-described polishing methods may be applied either all over the upper surface of substrate 100, or locally on a portion only of the upper surface of substrate 100. In this last case, a mask, not shown, may be arranged on the upper surface of substrate 100 during the step of multiple ion implantation, delimiting the area to be polished.

It should further be noted that the variants described in relation with FIGS. 4 and 5 may be combined.

Finally, the practical implementation of the described embodiments and variations is within the abilities of those skilled in the art based on the functional indications given hereabove.

The invention claimed is:

1. A method of polishing at least one area of a semiconductor substrate, comprising:
  a) a step of multiple implantations of ions from an upper surface of the substrate, to modify the semiconductor material of an upper portion of said area of the substrate, the multiple implantations step comprising a plurality of successive implantations under different respective implantation orientations; and
  b) a step of selective removal of the upper portion of the substrate,
  wherein, at the end of step a), the upper portion forms a continuous layer of the modified semiconductor material extending all over the surface of said at least one area of the substrate.

2. The method according to claim 1, wherein the multiple implantations step comprises at least three successive implantations under different respective implantation orientations.

3. The method according to claim 1, wherein said successive implantations implemented at step a) are carried out with a same implantation depth in a direction normal to the mean plane of the substrate.

4. The method according to claim 1, wherein step a) comprises a plurality of successive implantations under different respective angles of incidence and with different respective implantation energies.

5. The method according to claim 1, wherein step a) comprises a plurality of successive implantations under a same angle of incidence and with a same implantation energy, under different respective angles in a plane parallel to the mean plane of the substrate.

6. The method according to claim 1, wherein the substrate is a single-crystal substrate.

7. The method according to claim 6, wherein step a) results in amorphizing said upper portion of said at least one area of the substrate.

8. The method according to claim 7, further comprising, after step a), a step of solid state recrystallization of a lower portion of said upper portion of said at least one area of the substrate.

9. The method according to claim 8, wherein said solid phase recrystallization phase is implemented before step b).

10. The method according to claim 8, wherein said solid phase recrystallization step is implemented jointly to step b).

11. The method according to claim 6, wherein step a) results in doping said upper portion of said at least one area of the substrate while keeping its single-crystal structure.

12. The method according to claim 1, wherein the ions implanted at step a) are ions from the group comprising nitrogen, oxygen, fluorine, silicon, argon, germanium, xenon, carbon, and phosphorus.

13. The method according to claim 1, wherein, at step b), the selective removal of the upper portion of said at least one area of the substrate is carried out by a method of thermal etching by means of a gaseous mixture.

14. The method according to claim 13, wherein the semiconductor substrate is made of silicon, and wherein the gaseous mixture is a mixture based on hydrochloric acid and on germane, with a possible additional hydrogen stream.

15. The method according to claim 1, wherein, at step a), the implantation conditions are selected to be adapted to causing a mechanical abrasion of the upper surface of the substrate.

* * * * *